United States Patent
Song et al.

(10) Patent No.: US 11,495,391 B2
(45) Date of Patent: Nov. 8, 2022

(54) INDUCTOR

(71) Applicant: SAMSUNG ELECTRO-MECHANICS CO., LTD., Suwon-si (KR)

(72) Inventors: Seung Jae Song, Suwon-si (KR); Sang Jong Lee, Suwon-si (KR); Su Bong Jang, Suwon-si (KR); Seung Hee Hong, Suwon-si (KR); Min Ki Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 596 days.

(21) Appl. No.: 16/353,170

(22) Filed: Mar. 14, 2019

(65) Prior Publication Data

US 2020/0013537 A1    Jan. 9, 2020

(30) Foreign Application Priority Data

Jul. 3, 2018 (KR) ................ 10-2018-0077250

(51) Int. Cl.
*H01F 5/00* (2006.01)
*H01F 27/28* (2006.01)
(Continued)

(52) U.S. Cl.
CPC ....... *H01F 27/2804* (2013.01); *H01F 27/292* (2013.01); *H01F 27/323* (2013.01); *H01F 2027/2809* (2013.01); *H03H 7/38* (2013.01)

(58) Field of Classification Search
CPC .................................................. H01F 27/323
(Continued)

(56) References Cited

U.S. PATENT DOCUMENTS 5,250,923 A * 10/1993 Ushiro ................ H01F 17/0013
                                                                               333/184
6,339,320 B1 * 1/2002 Spremo ............... H01F 27/2804
                                                                               323/355
(Continued)

FOREIGN PATENT DOCUMENTS

EP           1085538 A1    9/2000
JP       2001-085230 A    3/2001
(Continued)

OTHER PUBLICATIONS

Korean Office Action dated Sep. 22, 2022, issued in corresponding Korean Patent Application No. 10-2018-0077250.

*Primary Examiner* — Ronald Hinson
(74) *Attorney, Agent, or Firm* — Morgan, Lewis & Bockius LLP

(57) ABSTRACT

An inductor includes a body including a plurality of insulating layers and a plurality of coil patterns are disposed on each of the plurality of insulating layers, and first and second external electrodes disposed on an external surface of the body. The plurality of coil patterns are connected to each other by coil connecting portions and both end portions thereof are electrically connected to the first and second external electrodes through coil lead portions, respectively, to form a coil. The plurality of coil patterns include coil patterns disposed on an outer portion of the body and coil patterns disposed on an inner portion of the body, the coil patterns disposed on the inner portion of the body include first coil patterns electrically connected in parallel, and at least one of the first coil patterns includes an internal side portion having a shape different from shapes of remaining coil patterns.

17 Claims, 7 Drawing Sheets

(51) Int. Cl.
*H01F 27/32* (2006.01)
*H01F 27/29* (2006.01)
*H03H 7/38* (2006.01)

(58) Field of Classification Search
USPC .......................................................... 336/200
See application file for complete search history.

(56) References Cited

U.S. PATENT DOCUMENTS

| | | |
|---|---|---|
| 2008/0157913 A1 | 7/2008 | Kim |
| 2013/0200980 A1 | 8/2013 | Yokohyama et al. |
| 2014/0232504 A1* | 8/2014 | Tachibana ............ H01F 27/292 336/200 |
| 2014/0253277 A1 | 9/2014 | Takezawa |
| 2015/0028988 A1* | 1/2015 | Yamauchi ........... H01F 17/0013 336/200 |
| 2015/0371753 A1* | 12/2015 | Lee ..................... H01F 17/0013 336/192 |
| 2017/0103846 A1 | 4/2017 | Yoneda |
| 2017/0110236 A1* | 4/2017 | Jang ..................... H01F 41/043 |

FOREIGN PATENT DOCUMENTS

| | | |
|---|---|---|
| JP | 2013-162101 A | 9/2013 |
| JP | 2014-175383 A | 9/2014 |
| KR | 10-0863009 B1 | 10/2008 |
| KR | 10-0869741 B1 | 11/2008 |
| KR | 10-2014-0103039 A | 8/2014 |
| KR | 10-2015-0014390 A | 2/2015 |
| WO | WO2016/006542 A1 | 4/2017 |

\* cited by examiner

INDUCTOR

CROSS-REFERENCE TO RELATED APPLICATION(S)

This application claims the benefit of priority to Korean Patent Application No. 10-2018-0077250 filed on Jul. 3, 2018 in the Korean Intellectual Property Office, the disclosure of which is incorporated herein by reference in its entirety.

TECHNICAL FIELD

The present disclosure relates to an inductor.

BACKGROUND

Recently, smartphones have used signals within many frequency bands, due to the application of multiband long term evolution (LTE). Thus, high frequency inductors are commonly used in impedance matching circuits in signal transmission/reception RF systems. Such high frequency inductors are required to have a small size and high capacity. In addition, high frequency inductors have a high self-resonant frequency (SRF) in a high frequency band and low resistivity, and thus, are required to be used at a high frequency of 100 MHz or higher. Also, a high Q characteristic is required to reduce loss in a frequency being used.

To have such high Q characteristics, characteristics of a material forming a body of an inductor have a greatest influence. However, even when the same material is used, the Q value may vary depending on shapes of an inductor coil. Therefore, it is necessary to finely adjust an inductance value depending on dispersion of an internal coil structure, while maintaining higher Q characteristics by optimizing the shape of the coil of the inductor.

SUMMARY

An aspect of the present disclosure is to provide an inductor which may finely adjust an inductance value, while having a high Q characteristic as coil patterns connected in parallel are provided with internal side shapes different from each other.

According to an aspect of the present disclosure, an inductor includes a body including a plurality of insulating layers and a plurality of coil patterns disposed on each of the plurality of insulating layers; and first and second external electrodes disposed on an external surface of the body. The plurality of coil patterns are connected to each other by coil connecting portions, and both end portions thereof are electrically connected to the first and second external electrodes through coil lead portions, respectively, to form a coil. The plurality of coil patterns include coil patterns disposed on an outer portion of the body and coil patterns disposed on an inner portion of the body, the coil patterns disposed on the inner portion of the body include first coil patterns electrically connected in parallel, and at least one of the first coil patterns includes an internal side portion having a shape different from shapes of remaining coil patterns.

According to another aspect of the present disclosure, an inductor includes a body including a plurality of insulating layers and a plurality of coil patterns disposed on each of the plurality of insulating layers; and first and second external electrodes disposed on an external surface of the body. The plurality of coil patterns are connected to each other by coil connecting portions, and both end portions thereof are electrically connected to the first and second external electrodes through coil lead portions, respectively, to form a coil. The plurality of coil patterns include coil patterns disposed an outer portion of the body and coil patterns disposed on an inner portion of the body, the coil patterns disposed on the inner portion of the body include first coil patterns electrically connected in parallel, and at least one of the first coil patterns has a line width different from line widths of remaining coil patterns.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
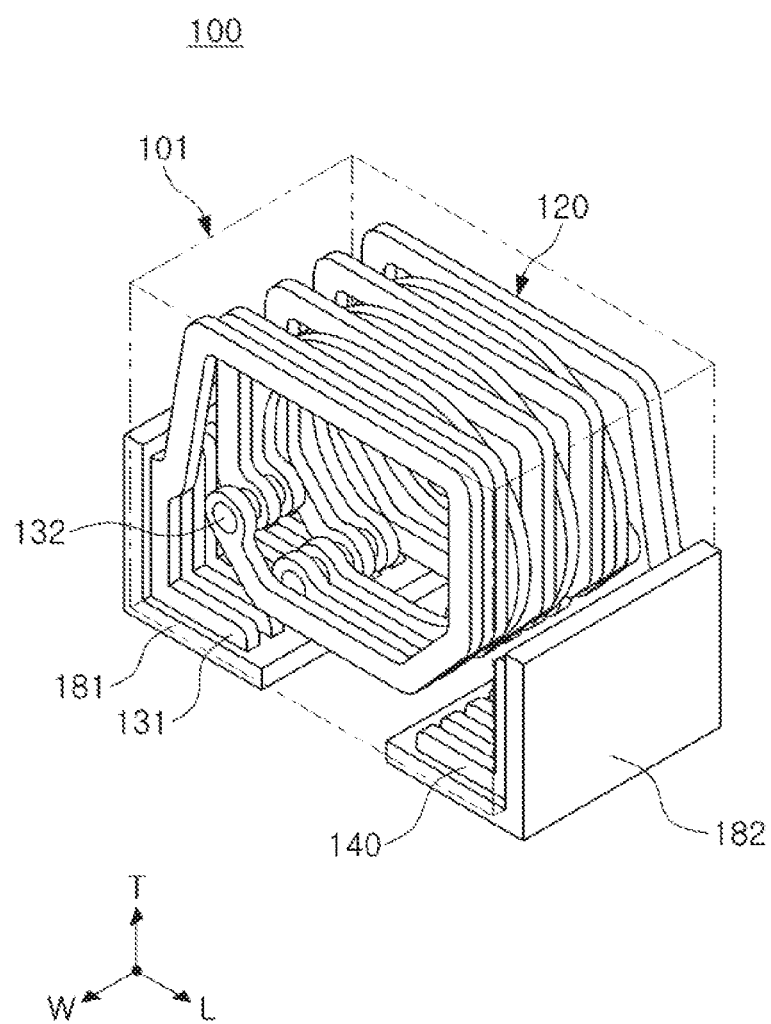
FIG. 1 is a perspective view of an inductor according to a first example.

Hereinafter, examples of the present disclosure will be described as follows with reference to the attached drawings.

The present disclosure may, however, be embodied in many different forms and should not be construed as limited to the examples set forth herein. Rather, these examples are provided so that this disclosure will be thorough and complete, and will fully convey the scope of the present disclosure to those skilled in the art.

The same reference numerals are used to designate the same elements throughout the drawings. In the drawings, the sizes and relative sizes of layers and regions may be exaggerated for clarity.

Hereinafter, W, L, and T in drawings may be defined as a first direction, a second direction, and a third direction, respectively.

Figure 2:
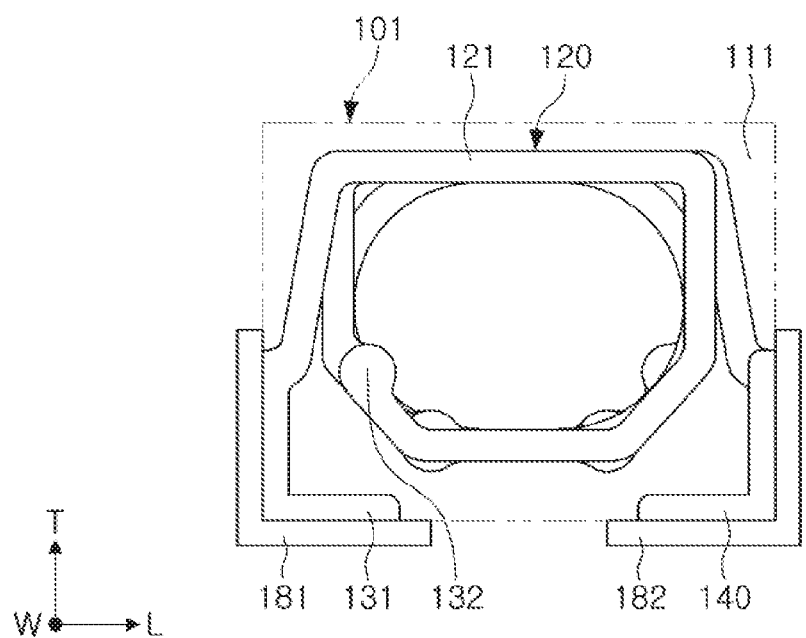
FIG. 2 is a front view of the inductor in FIG. 1.
Figure 3:
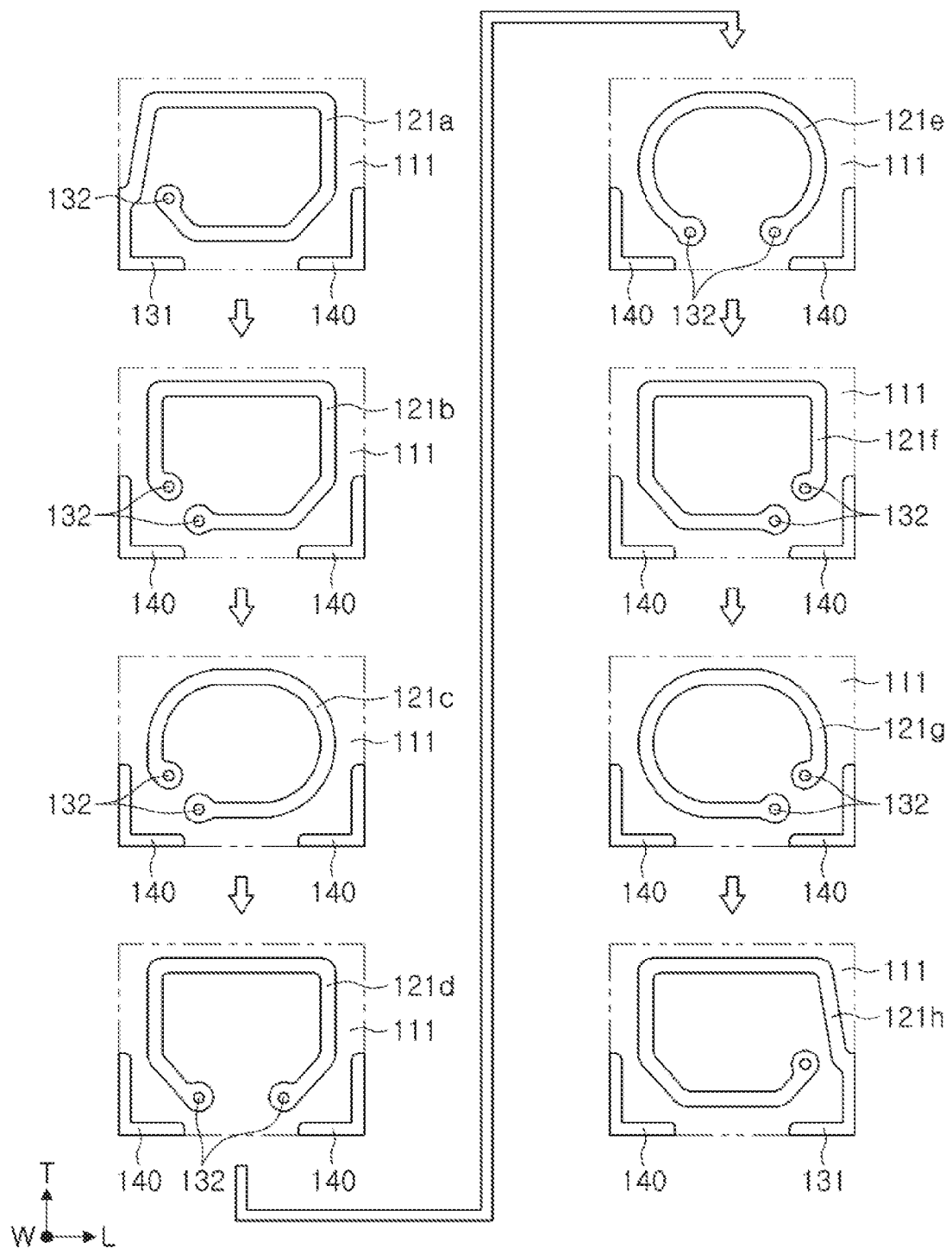
FIG. 3 is views of the inductor in FIG. 1.

FIG. 1 is a perspective view of an inductor according to a first example. FIG. 2 is a front view of the inductor in FIG. 1, and FIG. 3 is views of the inductor in FIG. 1.

A structure of an inductor 100 according to a first example will be described with reference to FIGS. 1 to 3.

A body 101 of the inductor 100 may be formed by laminating a plurality of insulating layers 111 in a first direction horizontal to a mounting surface.

The insulating layer 111 may be a magnetic layer or a dielectric layer.

In a case in which the insulating layer 111 is a dielectric layer, the insulating layer 111 may include barium titanate ($BaTiO_3$)-based ceramic powder particles, or the like. In this case, the $BaTiO_3$-based ceramic powder particle may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, prepared by partially employing calcium (Ca), zirconium (Zr), and the like, in $BaTiO_3$, but a material included in the insulating layer 111 is not limited thereto.

In a case in which the insulating layer 111 is a magnetic layer, an appropriate material which may be used as a body of the inductor may be selected as a material of the insulating layer 111, and examples thereof may include resins, ceramics, and ferrite. In the present example, the magnetic layer may use a photoimageable dielectric (PID), allowing a fine pattern to be implemented through a photolithography process. For example, the magnetic layer may be formed of a photoimageable dielectric (PID), so that a coil pattern, a coil lead portion 131, and coil connecting portions 132 may be minutely formed to contribute to miniaturization and function improvement of the inductor 100. To this end, the magnetic layer may include, for example, a photosensitive organic material or a photosensitive resin. In addition, the magnetic layer may further include an inorganic component, such as $SiO_2/Al_2O_3/BaSO_4$/Talc, as a filler component.

First and second external electrodes 181 and 182 may be disposed on an external surface of the body 101.

For example, the first and second outer electrodes 181 and 182 may be disposed on a mounting surface of the body 101. The mounting surface refers to a surface facing a printed circuit board (PCB) when an inductor is mounted on the PCB.

The external electrodes 181 and 182 serve to electrically connect the inductor 100 to the PCB when the inductor 100 is mounted on the PCB. The external electrodes 181 and 182 are disposed and spaced apart from each other on the edges of the body 101 in a first direction and in a second direction horizontal to the mounting surface. The external electrodes 181 and 182 may include, for example, a conductive resin layer and a conductive layer disposed on the conductive resin layer, but are not limited thereto. The conductive resin layer may include at least one conductive metal selected from the group consisting of copper (Cu), nickel (Ni), and silver (Ag), and a thermosetting resin. The conductive layer may include at least one selected from the group consisting of nickel (Ni), copper (Cu), and tin (Sn). For example, a nickel layer and a tin layer may be sequentially formed.

Referring to FIGS. 1 to 3, coil patterns 121 (121a to 121f) may be formed on the insulating layer 111.

The coil patterns 121a to 121f may be electrically connected to adjacent coil patterns by coil connecting portions 132. For example, helical coil patterns 121a to 121f are connected by the coil connecting portions 132 to form the coil 120. Both end portions of the coil 120 are connected to first and second external electrodes 181 and 182 by the coil lead portion 131, respectively. The coil connecting portions 132 may have a greater line width than the coil patterns 121a to 121f to improve connectivity between the coil patterns 121a to 121f and include conductive vias penetrating the insulating layer 111.

The coil lead portion 131 may be exposed to both end portions of the body 101 in the length direction and may also be exposed to a bottom surface as a board mounting surface. Accordingly, the coil lead portion 131 may have an L-shaped in a cross-section in a length-thickness direction of the body 101.

Referring to FIGS. 2 and 3, a dummy electrode 140 may be formed at a position corresponding to the external electrodes 181 and 182 in the insulating layer 111. The dummy electrode 140 may serve to improve adhesion between the external electrodes 181 and 182 and the body 101 or may serve as a bridge when the external electrodes 181 and 182 are formed by plating.

The dummy electrode 140 and the coil lead portion 131 may be connected to each other by a via electrode (not shown).

As a material of the coil patterns 121a to 121f, the coil lead portion 131, and the coil connecting portions 132, a conductive material such as copper (Cu), aluminum (Al), silver (Ag), tin (Sn), gold (Au), nickel (Ni), lead (Pb), or alloys thereof, having improved conductivity, may be used. The coil pattern 121, the coil lead portion 131, and the coil connecting portions 132 may be formed by a plating method or a printing method, but a forming method thereof is not limited thereto.

The inductor 100 according to the present example is formed by forming the coil patterns 121a to 121f, the coil lead portions 131 or the coil connecting portions 132, and the like, on the insulating layers 111 and subsequently laminating the insulating layers 111 in the first direction horizontal to the mounting surface. Thus, the inductor 100 may be manufactured more easily than the related art. In addition, since the coil patterns 121a to 121f are disposed to be perpendicular to the mounting surface, magnetic flux may be prevented from being affected by the mounting substrate.

Referring to FIGS. 2 and 3, in the coil 120 of the inductor 100 according to the first example, when projected in the first direction, the coil patterns 121a to 121h overlap each other to form a coil track having one or more coil turns.

Specifically, the first external electrode 181 and the first coil pattern 121a are connected by the coil lead portion 131. Then, the second to seventh coil patterns 121b to 121g are sequentially connected by the coil connecting portion 132.

The first coil pattern 121a is connected to the first external electrode 181 by the coil lead portion 131, and the eighth coil pattern 121h is connected to the second external electrode 182 by the coil lead portion 131.

According to the first example, the second to seventh coil patterns 121b to 121g are connected in parallel in pairs.

Referring to FIG. 3, among the coil patterns, the first coil pattern 121a and the eighth coil pattern 121h correspond to coil patterns disposed on an outer portion of the body 101, and the second to seventh coil patterns 121b to 121g corresponding to coil patterns disposed on an inner portion of the body 101.

The phrase "coil patterns are connected in parallel" means that among coil patterns disposed on the insulating layer 111, adjacent two or more coil patterns have the same shape and are connected by coil connecting portions 132 disposed at the same position.

According to the first example, the coil patterns 121b to 121g disposed on the inner portion of the body 101 include coil patterns connected in parallel, and one or more of the coil patterns 121b to 121g connected in parallel include internal side portions having different shapes from each other.

For example, an inductor according to the first example has a high Q characteristic, and one or more internal side portions of the coil patterns connected in parallel have different shapes from each other such that an inductance value may be finely adjusted.

As illustrated in FIG. 3, the coil patterns 121b to 121g connected in parallel are connected in parallel in pairs, but are not limited thereto, and three or more patterns may be connected to in parallel.

The coil connecting portion 132 may be disposed at the same position of the coil patterns 121b to 121g connected in parallel.

For example, in the first example, the patterns 121b to 121g connected in parallel do not have the same shape, but the coil connecting portion 132 is disposed at the same position. Therefore, the coil patterns 121b to 121g may be patterns connected in parallel.

In general, since coil patterns connected in parallel have the same shape, they have the same line width and line thickness.

In the case of an inductor fabricated by laminating coil patterns, having the same shape, in parallel, inductance is determined to a constant value, and it is difficult to adjust a minute inductance value.

In the case in which coil patterns, connected in parallel, having the same shape are laminated, resistance is increased at a high frequency by an overlapping area between a pair of coils.

In the present example, the coil patterns 121b to 121g connected in parallel are provided to have different shapes from each other. Thus, impedance may be adjusted to have various values to easily implement desired design capacitance and to improve Q characteristics.

A method of allowing the coil patterns 121b connected in parallel to have different shapes is not limited. For example, similarly to the first example, internal side portions are adjusted to have different shapes, widths are rendered different from each other, or shapes of corner portions of the coils patterns 121b to 121g connected in parallel are changed, but the method are not limited thereto.

In other words, the first example is characterized in that inductance may be finely adjusted, and the coil patterns 121b to 121g connected in parallel are implemented to have different shapes such that the impedance can be adjusted to have various values.

In the first example, in at least one of the coil patterns 121b to 121g connected in parallel, internal side portions may be adjusted to have different shapes to finely adjust inductance.

Specifically, internal side portions of the core patterns connected in parallel may be core portions. Since the core portions have different shapes, there is a difference in inductance, unlike a related-art structure in which coil patterns, connected in parallel, have the same shape. Thus, inductance may be finely adjusted.

In the first example, the plurality of coil patterns 121b to 121g connected in parallel may include corner portions having different shapes from each other.

As a method of adjusting shapes of the respective internal side portions of at least one of the coil patterns 121b to 121g connected in parallel to be different from each other, corner portions of a plurality of coil patterns 121b to 121g connected in parallel may be provided to have different shapes.

As set forth above, the corner portions of the plurality of coil patterns 121b to 121g connected in parallel are provided to have different shapes. For example, in the case in which one of the coil patterns connected in parallel has an angled corner portion, corner portions of other coil patterns connected in parallel may be implemented to have a rounded-surface structure.

In this case, at least one of upper and lower end regions of the plurality of coil patterns 121b to 121g connected in parallel may be different in the shape of a corner portion.

For example, in the case in which one of the coil patterns connected in parallel includes a corner having an angled shape, an upper end region of a corner portion of another coil pattern may have a rounded-surface structure, or a lower end region thereof may have a rounded-surface structure. That is, one of the coil patterns connected in parallel can have an angled shape in one region and have a rounded-surface structure in another region. Alternatively, both the upper and lower end regions may be implemented to have a rounded-surface structure.

In detail, in the case in which an upper end region is formed to have a rounded-surface structure, an inductance value may be easily adjusted to obtain a high Q characteristic.

As illustrated in FIG. 3, the coil patterns 121b to 121g disposed on the inner portion of the body 101 include coil patterns connected in parallel and are connected in parallel in pairs. All the coil patterns connected in parallel include internal side portions having different shapes from each other.

As set forth above, in the first example, respective internal side portions of at least one of the coils patterns 121b to 121g connected in parallel have different shapes. In addition to the feature, at least one of the coil patterns 121b to 121g connected in parallel may have a different line width.

Due to the above-described feature, inductance may be finely adjusted. In addition, line widths may be adjusted to be different from each other. Thus, an overlapping area between coils connected in parallel may be decreased to reduce a proximity effect at a high frequency. As a result, resistance may be decreased to improve Q characteristics.

The coil pattern 121b and 121g, disposed on the inner portion of the body 101 and disposed adjacent to the coil patterns disposed on the outer portion of the body 101, have different shapes from each other.

For example, second and seventh coil patterns 121b and 121g, disposed adjacent to first and eighth coil patterns 121a and 121h disposed on the outer portion of the body 101, have shapes different from shapes of the first and eighth coil patterns 121a and 121h, respectively.

In the inductor 100 according to the first example, coil patterns disposed on the outer portion of the body 101 may include at least two patterns connected in parallel. The at least two patterns, connected in parallel and included in the coil patterns disposed on the outer portion of the body 101, may include internal side portions having different shapes from each other.

Also the at least two patterns, connected in parallel and included in the coil patterns disposed on the outer portion of the body 101, may include corner portions having different shapes from each other.

In an example, coil patterns disposed on the outer portion of the body 101 also include at least two patterns connected in parallel. Thus, inductance may be finely adjusted, and a Q characteristic improvement effect may be superior.

Figure 4:
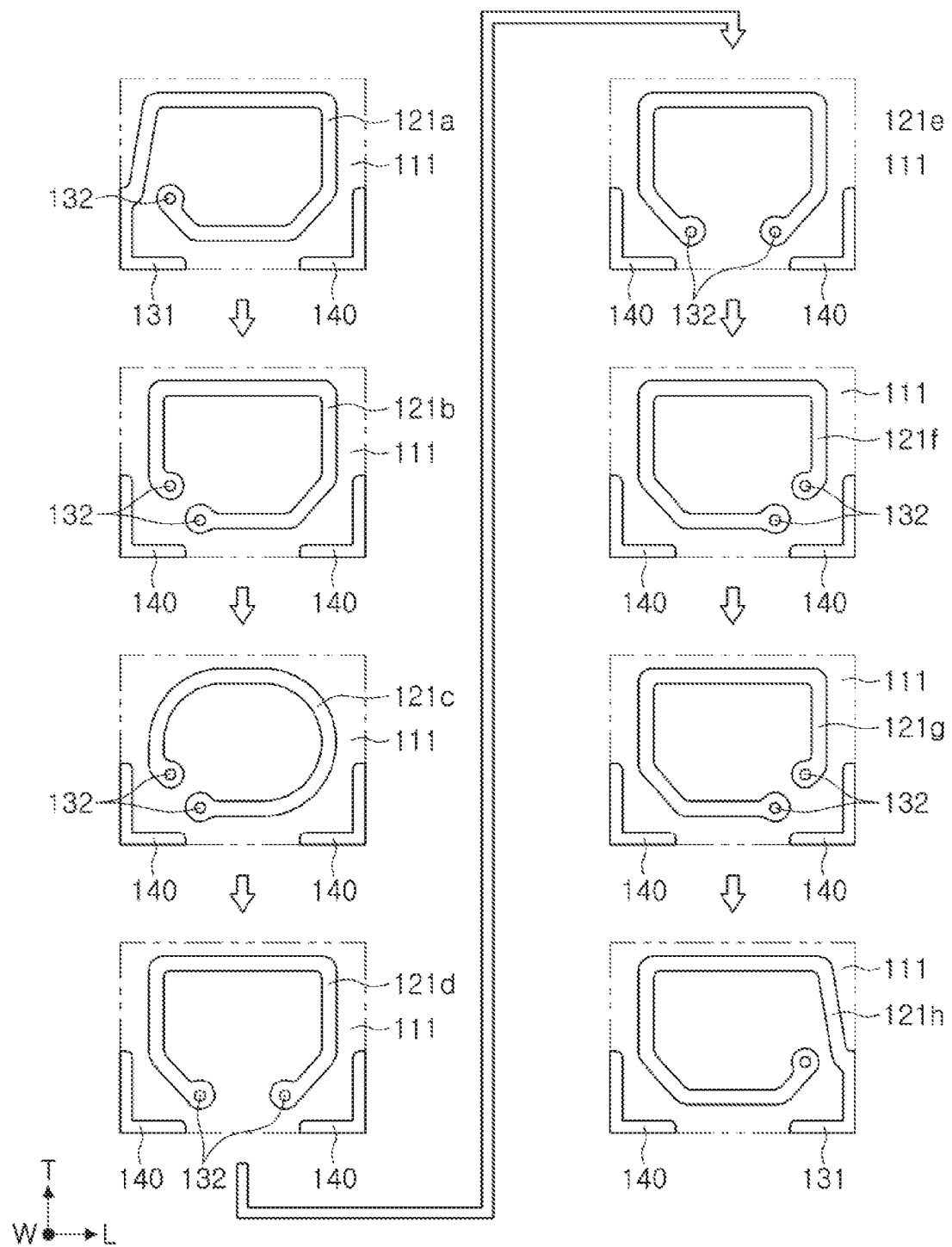
FIG. 4 is views of an inductor according to a second example.

FIG. 4 is views of an inductor according to a second example.

Referring to FIG. 4, an inductor according to a second example has the same features as the inductor 100 according to the first example. However, in the inductor according to the second example, coil patterns 121b to 121g disposed on an inner portion of the body 101 include coil patterns connected in parallel and are connected in parallel in pairs. Among the coil patterns connected in parallel, only a pair of coil patterns 121b and 121c may include internal side portions having different shapes from each other.

Figure 5:
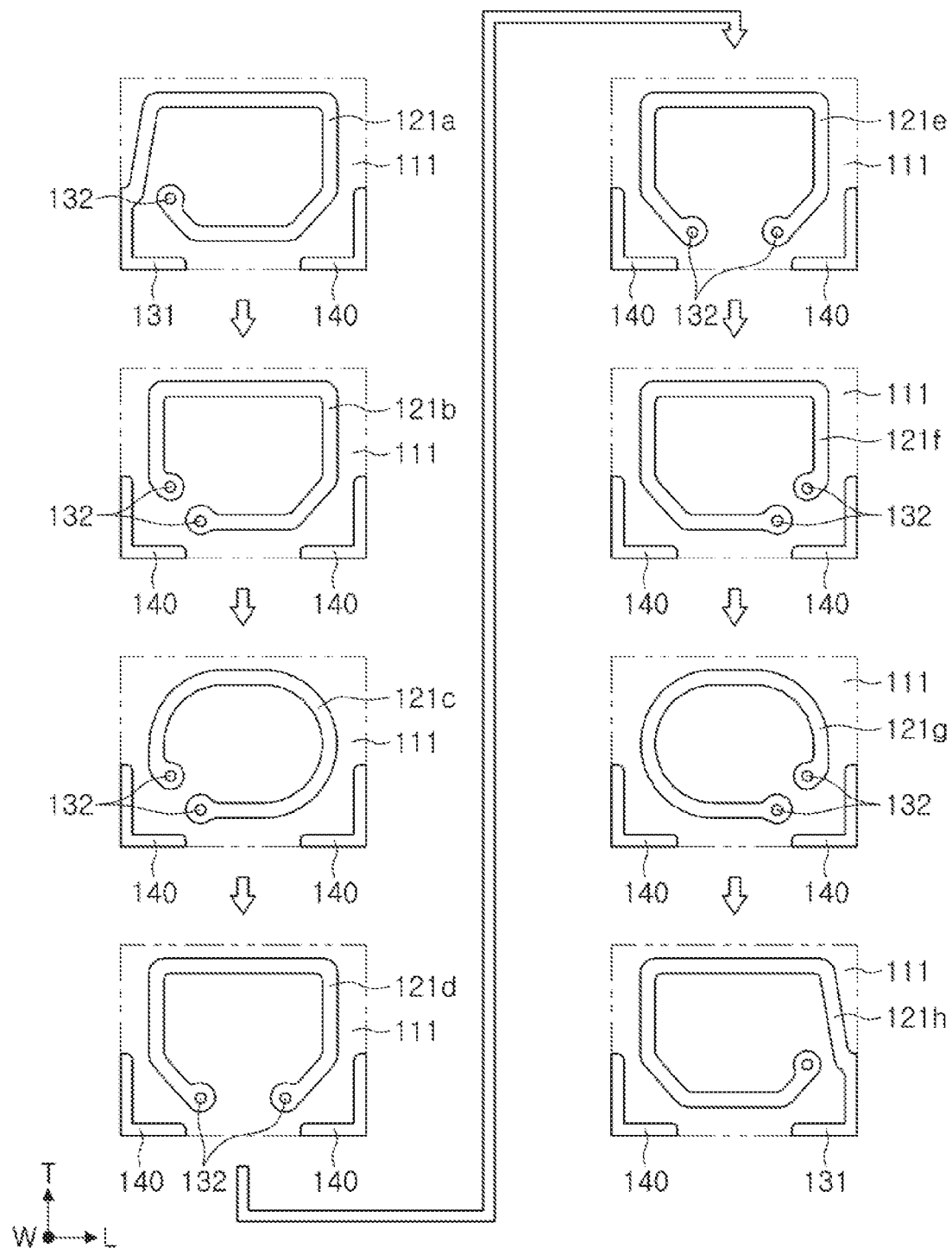
FIG. 5 is views of an inductor according to a third example.

FIG. 5 is views of an inductor according to a third example.

Referring to FIG. 5, an inductor according to a third example has the same features as the inductor 100 according to the first example. However, in the inductor according to the third example, coil patterns 121b to 121g disposed on an inner portion of the body 101 include coil patterns connected in parallel and are connected in parallel in pairs. Among the coil patterns connected in parallel in pairs, only two pairs of patterns 121*b* and 121*c*, and 121*f* and 121*g* connected in parallel include internal side portions having different shapes from each other.

Figure 6:
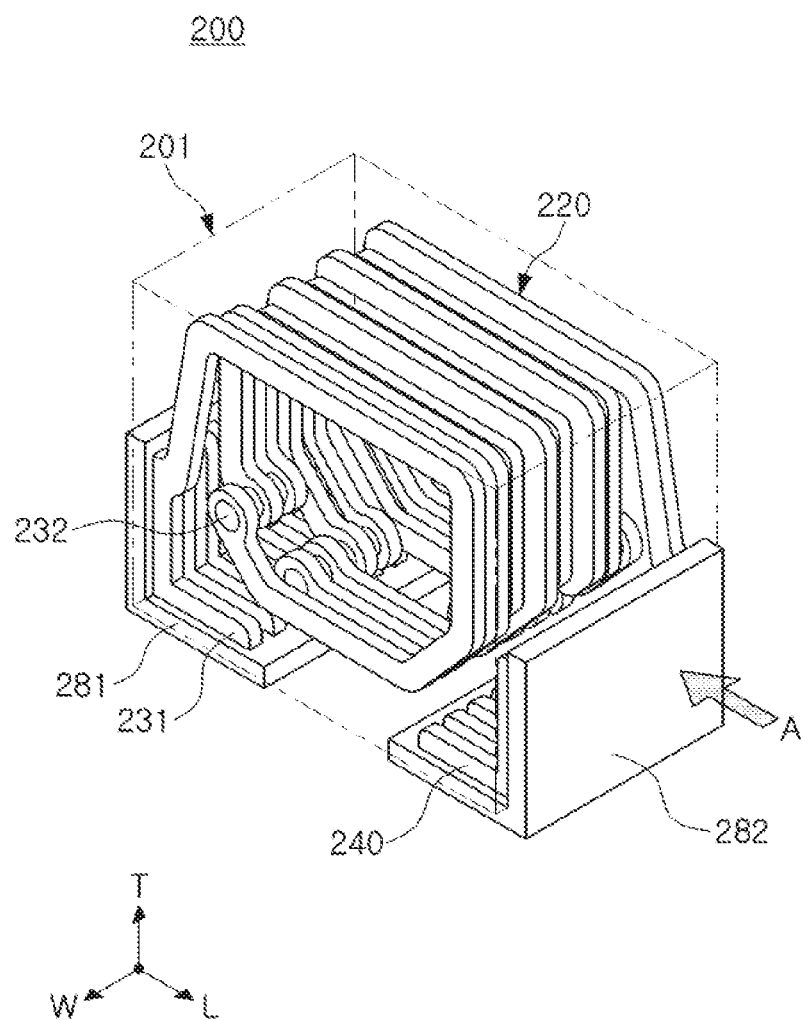
FIG. 6 is a perspective view of an inductor according to a fourth example.
Figure 7:
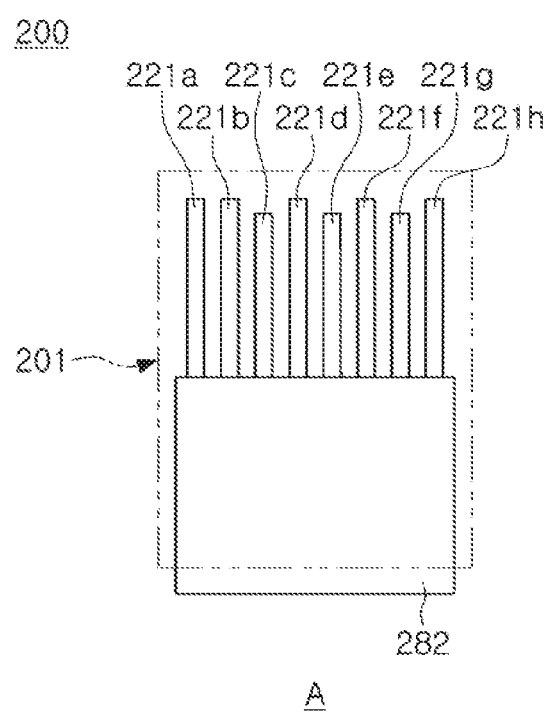
FIG. 7 is a perspective view when viewed in a direction A in FIG. 6.

FIG. 6 is a perspective view of an inductor according to a fourth example; and FIG. 7 is a perspective view when viewed in a direction A in FIG. 6.

Referring to FIGS. 6 and 7, an inductor according to the fourth example includes a body 201 in which a plurality of insulating layers, on which coil patterns 221*a* to 221*h* are disposed, are laminated and first and second external electrodes 281 and 282 disposed on an external surface of the body 201. The plurality of coil patterns 221*a* to 221*h* are connected to each other through a coil connection portion 232, and both end portions thereof are connected to the first and second external electrodes 281 and 282 through coil lead portions 231, respectively, to form a coil 220. The plurality of coil patterns 221*a* to 221*h* include coil patterns disposed an outer portion of the body 201 and coil patterns disposed on an inner portion of the body 201. The coil patterns 221*b* to 221*g* disposed on the inner portion of the body 201 include coil patterns connected in parallel. At least one of the coil patterns 221*b* to 221*g* connected in parallel has a different line width.

According to the fourth example, in the at least one of the coil patterns 221*b* to 221*g* connected in parallel, coil patterns connected in parallel are adjusted to have different line widths from each other. Thus, an overlapping area between coils connected in parallel may be decreased to reduce a proximity effect at a high frequency. As a result, resistance may be decreased to improve Q characteristics.

The fourth example may have not only the above-described feature but also the feature, in which at least one of the coil patterns 221*b* to 221*g* connected in parallel includes an internal side portion having a different shape, described in the first to third examples.

Thus, inductance of an inductor may be finely adjusted, and various inductances may be implemented during a design.

In addition, a dummy electrode may be formed at a position, corresponding to the external electrodes 281 and 282, on an insulating layer. The dummy electrode 240 may serve to improve adhesion between the body 201 and the external electrodes 281 and 282 or may serve as a bridge in the case in which an external electrode is formed by plating.

The dummy electrode 240 and the coil lead portion 231 may be connected to each other by a via electrode (not shown).

A detailed description of the same features of the inductors according to the fourth example as those of the inductor according to the first example will be omitted.

As described above, an inductor structure, in which internal side portions of coil patterns connected in parallel are disposed to have different shapes from each other, may be provided to implement high Q characteristics and to finely minute an inductance value.

While examples have been shown and described above, it will be apparent to those skilled in the art that modifications and variations could be made without departing from the scope of the present invention as defined by the appended claims.

What is claimed is:

1. An inductor comprising:
a body including a plurality of insulating layers and a plurality of coil patterns disposed on each of the plurality of insulating layers; and
first and second external electrodes disposed on an external surface of the body,
wherein the plurality of coil patterns are connected to each other by coil connecting portions, and both end portions thereof are electrically connected to the first and second external electrodes through coil lead portions, respectively, to form a coil,
the plurality of coil patterns include coil patterns disposed on an outer portion of the body and coil patterns disposed on an inner portion of the body,
the coil patterns disposed on the inner portion of the body include first coil patterns electrically connected to each other,
each of the first coil patterns includes two ends and an internal side portion connecting the two ends to each other,
among two adjacent coil patterns of the first coil patterns, each end of one coil pattern is connected to a corresponding end of the other coil pattern via a coil connecting portion, and
shapes of the internal side portions of the two adjacent coil patterns are different from each other.

2. The inductor of claim 1, wherein the first coil patterns electrically connected in parallel have corner portions having shapes different from each other.

3. The inductor of claim 1, wherein at least one of an upper end region or a lower end region of at least one of the first coil patterns electrically connected in parallel has a corner portion having a shape different from shapes of remaining coil patterns.

4. The inductor of claim 1, wherein the internal side portion of each of the first coil patterns electrically connected in parallel is a core portion.

5. The inductor of claim 1, wherein the coil connecting portions of the first coil patterns electrically connected in parallel are disposed at same positions with respect to planes perpendicular to a stacking direction of the plurality of coil patterns.

6. The inductor of claim 1, wherein a coil pattern, disposed on the inner portion of the body and disposed adjacent to a coil pattern disposed on the outer portion of the body, has a shape different from a shape of the coil pattern disposed on the outer portion of the body.

7. The inductor of claim 1, wherein the coil patterns disposed on the inner portion of the body include at least two patterns electrically connected in parallel.

8. The inductor of claim 7, wherein the at least two patterns, electrically connected in parallel and included in the coil patterns disposed on the inner portion of the body, include internal side portions having different shapes from each other.

9. The inductor of claim 7, wherein the at least two patterns, electrically connected in parallel and included in the coil patterns disposed on the inner portion of the body, include corner portions having different shapes from each other.

10. The inductor of claim 1, wherein the plurality of coil patterns are laminated in a direction perpendicular to a substrate mounting surface.

11. The inductor of claim 1, wherein at least one of the first coil patterns electrically connected in parallel has a different line width.

12. The inductor of claim 1, wherein a dummy electrode is disposed in each of the plurality of insulating layers at a position corresponding to the first or second external electrode,
wherein the dummy electrode and the coil lead portions are connected to each other by a via electrode.

13. An inductor comprising:
a body including a plurality of insulating layers and a plurality of coil patterns disposed on each of the plurality of insulating layers; and
first and second external electrodes disposed on an external surface of the body,
wherein the plurality of coil patterns are connected to each other by coil connecting portions and both end portions thereof are electrically connected to the first and second external electrodes through coil lead portions, respectively, to form a coil,
the plurality of coil patterns include coil patterns disposed on an outer portion of the body and coil patterns disposed on an inner portion of the body,
the coil patterns disposed on the inner portion of the body include first coil patterns electrically connected in parallel, and
at least one of the first coil patterns has a line width different from line widths of remaining coil patterns of the first coil patterns.

14. The inductor of claim 13, wherein the at least one of the first coil patterns electrically connected in parallel includes an internal side portion having a shape different from shapes of the remaining coil patterns.

15. The inductor of claim 13, wherein the first coil patterns electrically connected in parallel have corner portions having different shapes from each other.

16. The inductor of claim 13, wherein at least one of an upper end region or a lower end region of the at least one of the first coil patterns electrically connected in parallel has a corner portion having a shape different from the shapes of the remaining coil patterns.

17. The inductor of claim 13, wherein the coil connecting portions of the first coil patterns electrically connected in parallel are disposed at same positions with respect to planes perpendicular to a stacking direction of the plurality of coil patterns.

* * * * *